United States Patent
Lee et al.

(10) Patent No.: US 12,281,991 B2
(45) Date of Patent: Apr. 22, 2025

(54) INSPECTION LAYER TO IMPROVE THE DETECTION OF DEFECTS THROUGH OPTICAL SYSTEMS AND METHODS OF INSPECTING SEMICONDUCTOR DEVICE FOR DEFECTS

(71) Applicant: Taiwan Semiconductor Manufacturing Company Limited, Hsinchu (TW)

(72) Inventors: I-Che Lee, Taipei (TW); Huai-Ying Huang, Jhonghe (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/359,081

(22) Filed: Jul. 26, 2023

(65) Prior Publication Data

US 2023/0366833 A1 Nov. 16, 2023

Related U.S. Application Data (63) Continuation of application No. 17/412,380, filed on Aug. 26, 2021, now Pat. No. 11,761,905.

(51) Int. Cl.
*G01N 21/95* (2006.01)
*G01N 21/956* (2006.01)
*G06T 7/00* (2017.01)
*H01L 21/66* (2006.01)
*H01L 21/67* (2006.01)

(52) U.S. Cl.
CPC ... *G01N 21/9501* (2013.01); *G01N 21/95607* (2013.01); *G06T 7/001* (2013.01); *H01L 22/12* (2013.01); *G06T 2207/30148* (2013.01); *H01L 21/67023* (2013.01)

(58) Field of Classification Search
CPC .......... G01N 21/9501; G01N 21/95607; G06T 7/001; G06T 2207/30148; H01L 22/12; H01L 21/67023; H01L 22/34; H01L 22/20; H01L 22/30
See application file for complete search history.

(56) References Cited

U.S. PATENT DOCUMENTS

| | | | | |
|---|---|---|---|---|
| 5,444,529 A * | 8/1995 | Tateiwa | ................. | G01N 21/94 356/337 |
| 7,112,288 B2 * | 9/2006 | Clark | ...................... | H01L 22/24 216/60 |
| 7,130,037 B1 * | 10/2006 | Lange | .................. | G03F 7/70341 356/237.5 |
| 7,196,006 B2 * | 3/2007 | Lee | .......................... | H01L 22/24 257/E21.527 |
| 7,372,561 B2 * | 5/2008 | Shibata | .............. | H01L 21/67253 356/237.5 |

(Continued)

*Primary Examiner* — Roy M Punnoose
(74) *Attorney, Agent, or Firm* — The Marbury Law Group, PLLC (57) ABSTRACT

A semiconductor device inspection method including: depositing a dielectric material over a substrate to form an interconnect-level dielectric (ILD) layer; patterning the ILD layer to form via structures in the ILD layer; depositing an electrically conductive material to form an inspection layer on the ILD layer and in the via structures; optically inspecting light reflected from the inspection layer to generate image data; and detecting any defects in the via structures by analyzing the image data.

20 Claims, 9 Drawing Sheets

(56) References Cited

U.S. PATENT DOCUMENTS

| | | | |
|---|---|---|---|
| 7,460,206 B2* | 12/2008 | Weissenrieder | G03F 7/70983 355/30 |
| 7,599,545 B2* | 10/2009 | Shibata | G01N 21/9501 348/81 |
| 7,760,366 B2* | 7/2010 | Mengel | G03F 7/70341 356/521 |
| 8,488,127 B2* | 7/2013 | Mengel | G03F 7/70958 356/515 |
| 2004/0033631 A1* | 2/2004 | Clark | H01L 22/24 257/E21.527 |
| 2004/0125351 A1* | 7/2004 | Krautschik | G03F 7/70341 355/53 |
| 2005/0052642 A1* | 3/2005 | Shibata | G01N 21/95623 356/237.1 |
| 2005/0095730 A1* | 5/2005 | Mikami | G01B 11/0683 438/16 |
| 2005/0100745 A1* | 5/2005 | Lin | G02B 1/14 204/192.1 |
| 2006/0177777 A1* | 8/2006 | Kawamura | G03F 7/7065 430/395 |
| 2006/0181690 A1* | 8/2006 | Nishinaga | G03F 7/7015 355/53 |
| 2007/0064210 A1* | 3/2007 | Kobayashi | G03F 7/70958 355/53 |
| 2007/0064215 A1* | 3/2007 | Dirksen | G03F 7/70983 430/273.1 |
| 2007/0273869 A1* | 11/2007 | Van Hout | G03F 7/70591 356/124 |
| 2010/0005553 A1* | 1/2010 | Jin | B82Y 15/00 850/58 |
| 2011/0239167 A1* | 9/2011 | Rathsack | G03F 7/705 716/50 |
| 2020/0350218 A1* | 11/2020 | Kuo | H01L 21/76898 |
| 2021/0335673 A1* | 10/2021 | Huang | H01L 21/823481 |
| 2021/0399046 A1* | 12/2021 | Wu | H10B 63/34 |
| 2022/0308452 A1* | 9/2022 | Chang | H01L 21/6715 |

* cited by examiner

FIG. 5

INSPECTION LAYER TO IMPROVE THE DETECTION OF DEFECTS THROUGH OPTICAL SYSTEMS AND METHODS OF INSPECTING SEMICONDUCTOR DEVICE FOR DEFECTS

RELATED APPLICATIONS

This application is a continuation of U.S. patent application Ser. No. 17/412,380, entitled "Inspection Layer to Improve the Detection of Defects Through Optical System and Methods of Inspecting Semiconductor Device for Defects", filed Aug. 26, 2021, the entire contents of which is hereby incorporated by reference for all purposes.

BACKGROUND

Semiconductor device manufacturing typically involves the fabrication of an interconnect structure on a semiconductor device substrate. An interconnect structure may include metal interconnect structures embedded within stacked dielectric layers. In particular, the interconnect structures may be disposed in trenches and via holes formed in the stacked dielectric layers by patterning processes, such as etching. However, it may be difficult to determine whether a dielectric layer is properly etched. Accordingly, there is a need for improved methods of inspecting dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure relates to fabrication and inspection methods for semiconductor devices. In particular, various embodiments include improved methods for optically inspecting via structures formed in dielectric layers.

Semiconductor devices may include metal interconnect structures that are embedded in via structures, such as contact holes and trenches, formed in dielectric layers. In order to improve performance and/or reduce costs, the size of control elements of semiconductor devices, such as transistors, has been continuously reduced. As a result, the size of via structures and interconnect structures have also been reduced, for example, to micron-sized dimensions.

However, it may be difficult to optically inspect micron-sized to nano-sized structures using conventional optical techniques. Conventional optical techniques used optical metrology and electron beam methodology to inspect for defects on chips or wafers. As devices have shrunk and technology has advanced, the defects and/or yield killers have become smaller and smaller as well as harder to optically detect. For example, an unusual profile, residue, material, or by-products may exist on the bottom of a via that is extremely difficult to effectively inspect or detect. Thus, improved methodologies and techniques are desired to detect such defects.

Various embodiments provide improved manufacturing and inspection techniques that include the formation of inspection layers on dielectric layers that allow for via structures to be more accurately imaged and/or inspected. For example, the inspection layers may be configured to increase the accuracy of the optical detection of defects in via structures. In some embodiments, the inspection layer may increase the reflectivity of the dielectric layer and/or via structures. In various embodiments, the inspection layer may increase the contrast between via structures that include defects and via structures that do not include defects. As such, various embodiments provide improved optical inspection techniques that may increase fabrication yields and production speeds, which reduces production costs.

Figure 1A:
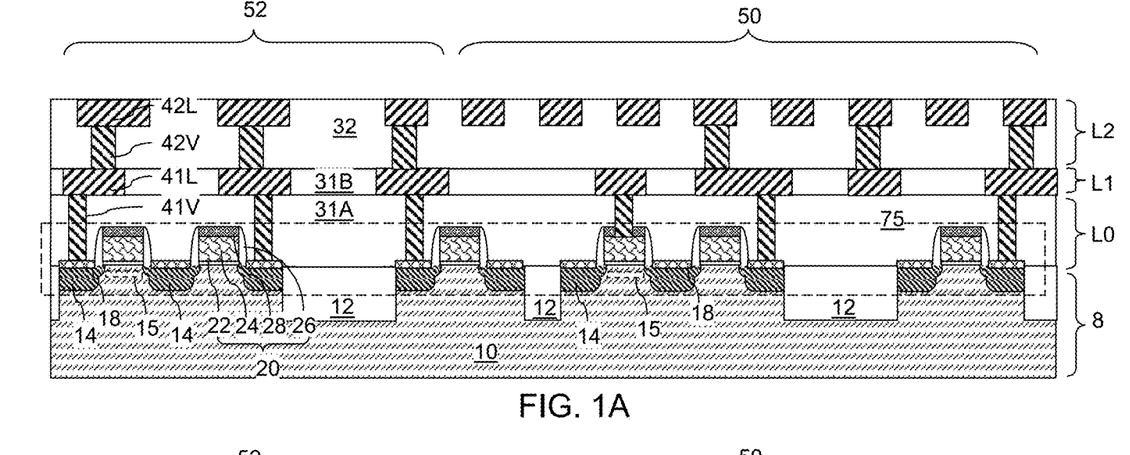
FIG. 1A is a vertical cross-sectional view of an exemplary first structure of a semiconductor device, after formation of complementary metal-oxide-semiconductor (CMOS) transistors, metal interconnect structures embedded in dielectric layers, and a connection-via-level dielectric layer according to an embodiment of the present disclosure.

FIG. 1A is a vertical cross-sectional view of an exemplary initial structure of a semiconductor device, including complementary metal-oxide-semiconductor (CMOS) transistors, metal interconnect structures embedded in dielectric layers, and a connection-via-level dielectric layer, according to various embodiments of the present disclosure. Referring to FIG. 1A, the initial structure includes complementary metal-oxide-semiconductor (CMOS) transistors and metal interconnect structures formed in dielectric layers.

Specifically, the initial structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). Shallow trench isolation structures 12 including a dielectric material such as silicon oxide may be formed in an upper portion of the substrate 8. Suitable doped semiconductor wells, such as p-type wells and n-type wells, may be formed within each area that may be laterally enclosed by a portion of the shallow trench isolation structures 12.

Field effect transistors may be formed over the top surface of the substrate 8. For example, each field effect transistor may include an active source/drain regions 14, a semiconductor channel 15 that includes a surface portion of the substrate 8 extending between the active source/drain regions 14, and a gate structure 20. Each gate structure 20 may include a gate dielectric 22, a gate electrode strip 24, a gate cap dielectric 28, and a dielectric gate spacer 26. An active source/drain metal-semiconductor alloy region 18 may be formed on each active source/drain region 14. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The initial structure may include a memory array region 50 in which an array of memory elements may be subsequently formed, and a peripheral region 52 in which logic devices that support operation of the array of memory elements may be formed. In one embodiment, devices (such as field effect transistors) in the memory array region 50 may include bottom electrode access transistors that provide access to bottom electrodes of memory cells to be subsequently formed. Top electrode access transistors that provide access to top electrodes of memory cells to be subsequently formed may be formed in the peripheral region 52 at this processing step.

Devices (such as field effect transistors) in the peripheral region 52 may provide functions that may be needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 8 may include complementary metal-oxide-semiconductor (CMOS) transistors and optionally additional semiconductor devices (such as resistors, diodes, capacitors, etc.), and are collectively referred to as CMOS circuitry 75.

Various interconnect-level structures may be subsequently formed, which are formed prior to formation of an array of fin back gate field effect transistors and are herein referred to as lower interconnect-level structures (L0, L1, L2). In case a two-dimensional array of TFTs is to be subsequently formed over two levels of interconnect-level metal lines, the lower interconnect-level structures (L0, L1, L2) may include an interconnect-level structure L0, a first interconnect-level structure L1, and a second interconnect-level structure L2. The dielectric layers may include, for example, a contact-level dielectric layer 31A, a first metal-line-level dielectric layer 31B, and a second line-and-via-level dielectric layer 32. Various metal interconnect structures embedded in dielectric layers may be subsequently formed over the substrate 8 and the devices (such as field effect transistors). The metal interconnect structures may include device contact via structures 41V formed in the contact-level dielectric layer 31A (interconnect-level structure L0) and contact a respective component of the CMOS circuitry 75, first metal line structures 41L formed in the first metal-line-level dielectric layer 31B (interconnect-level structure L1), first metal via structures 42V formed in a lower portion of the second line-and-via-level dielectric layer 32, second metal line structures 42L formed in an upper portion of the second line-and-via-level dielectric layer 32 (interconnect-level structure L2).

Each of the dielectric layers (31A, 31B, and 32) may include a dielectric material such as an undoped silicate glass (e.g., silicon oxide), a doped silicate glass, organosilicate glass, amorphous fluorinated carbon, porous variants thereof, or combinations thereof. Each of the metal interconnect structures (41V, 41L, 42V, and 42L) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 42V and the second metal line structures 42L may be formed as integrated line and via structures by a dual damascene process, and the second metal via structures 43V and the third metal line structures 43L may be formed as integrated line and via structures.

The dielectric layers (31A, 31B, and 32) may be located at a lower level relative to an array of memory cells to be subsequently formed. As such, the dielectric layers (31A, 31B, and 32) are herein referred to as lower-level dielectric layers, i.e., dielectric layer located at a lower level relative to the array of memory cells to be subsequently formed. The metal interconnect structures (41V, 41L, 42V, and 42L) are herein referred to lower-level metal interconnect structures. A subset of the metal interconnect structures (41V, 41L, 42V, and 42L) includes lower-level metal lines (such as the third metal line structures 42L) that are embedded in the lower-level dielectric layers and having top surfaces within a horizontal plane including a topmost surface of the lower-level dielectric layers. Generally, the total number of metal line levels within the lower-level dielectric layers (31A, 31B, and 32) may be in a range from 1 to 3.

The initial structure may include various devices regions, which may include a memory array region 50 in which at least one array of non-volatile memory cells may be subsequently formed. For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The initial structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Figure 1B:
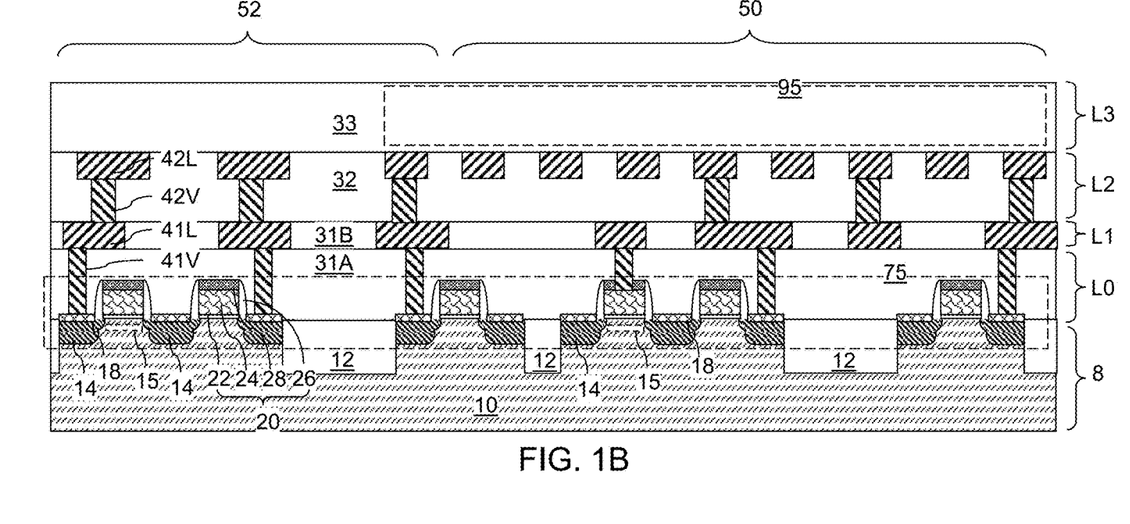
FIG. 1B is a vertical cross-sectional view of the first exemplary structure during formation of the array of fin back gate field effect transistors according to an embodiment of the present disclosure.

Referring to FIG. 1B, an array 95 of non-volatile memory cells and thin film transistor (TFT) selector devices may be formed in the memory array region 50 over the second interconnect-level structure L2. A third interconnect level dielectric (ILD) layer 33 may be formed during formation of the array 95 of non-volatile gated ferroelectric memory cells. The set of all structures formed at the level of the array 95 of non-volatile memory cells and gated ferroelectric memory cell devices is herein referred to as a third interconnect-level structure L3.

Figure 1C:
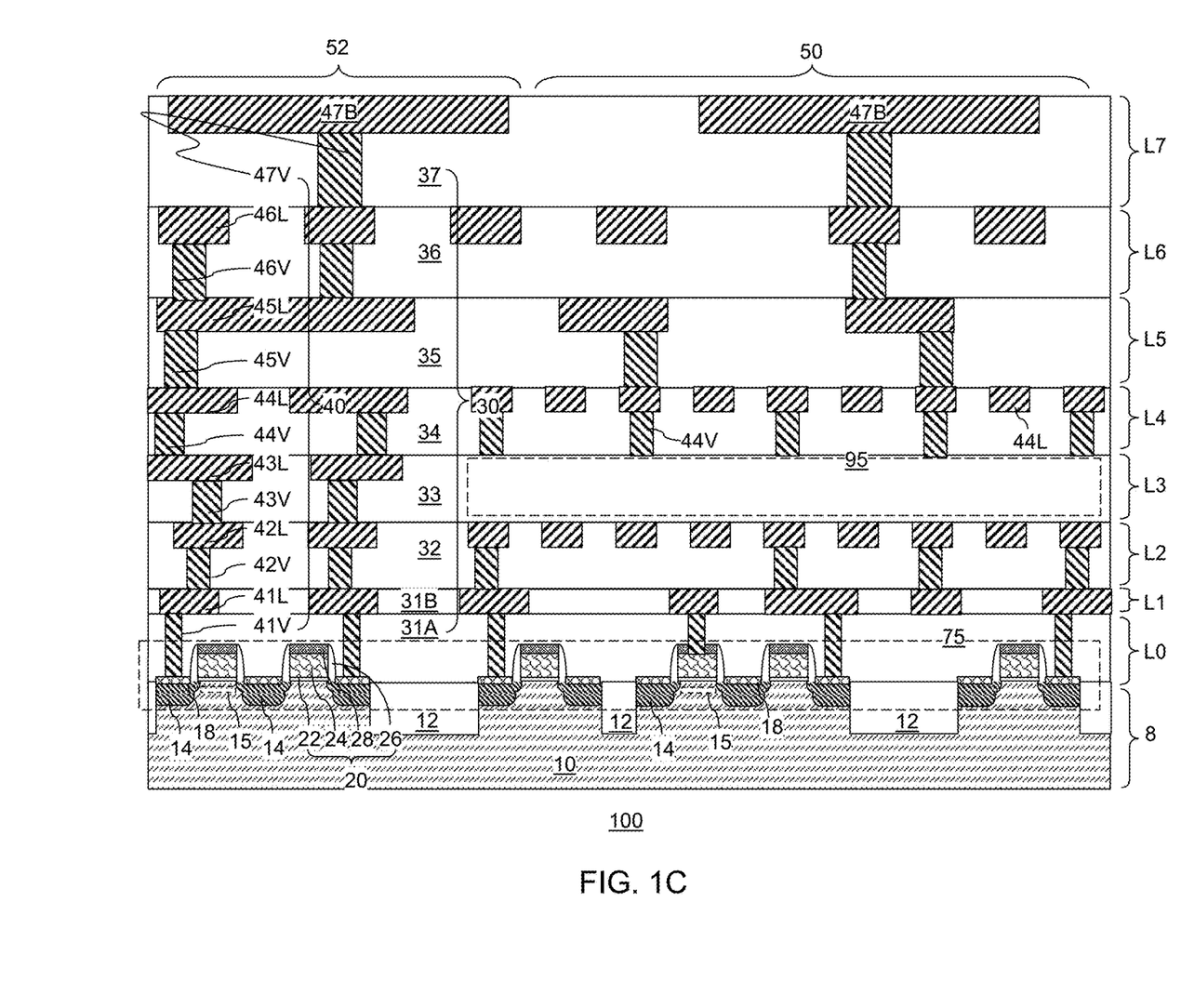
FIG. 1C is a vertical cross-sectional view of a semiconductor device 100 including upper-level metal interconnect structures formed on the first exemplary structure, according to an embodiment of the present disclosure.

Referring to FIG. 1C, the semiconductor device 100 may include third interconnect-level metal interconnect structures (43V, 43L) may be formed on the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

The ILD layers (i.e., 31A, 31B, 32, 33, 34, 35, 36, and 37) may be collectively or individually referred to as ILD layers 30. Each interconnect-level metal interconnect structure may be referred to as a metal interconnect structure 40. Each contiguous combination of a metal via structure and an overlying metal line located within a same interconnect-level structure (L2-L7) may be formed sequentially as two distinct structures by employing two single damascene processes or may be simultaneously formed as a unitary structure employing a dual damascene process. Each of the metal interconnect structures 40 (i.e., 41V, 41L, 42V, 42L, 43V, 43L, 44V, 44L, 45V, 45L, 46V, 46L, 47V, 47B) may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop layers and dielectric capping layers may be inserted between vertically neighboring pairs of ILD layers 30 or may be incorporated into one or more of the ILD layers 30.

While the present disclosure is described employing an embodiment in which the array 95 of non-volatile memory cells and selector devices may be formed as a component of a third interconnect-level structure L3, embodiments are expressly contemplated herein in which the array 95 of non-volatile memory cells and selector devices may be formed as components of any other interconnect-level structure (e.g., L1-L7). Further, while the present disclosure is described using an exemplary semiconductor device 100 including a set of eight interconnect-level structures, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50.

According to various embodiments, the interconnect-level structures (e.g., L1-L7) may be formed by depositing one of ILD layers 30, patterning the ILD 30 using an etching process to form via structures, such as through holes (e.g., contact holes or via holes) and/or channels, and then depositing an electrically conducive material in the via structures to form a corresponding one of the metal interconnect structures 40. The process may be repeated for each of the interconnect-level structures (e.g., L1-L7).

During the fabrication process, each ILD layer 30 may be inspected after the etching process is conducted, in order to determine whether via structures are properly formed. In particular, the inspection process may include an optical inspection process to determine whether the via structures include any defects. Defects may include partials (e.g., partially opened contact holes or bridges), missing contact holes/channels, and/or debris such as dielectric material particles lodged in contact holes. Such defects may reduce the final yield of a fabrication process. Accordingly, such defects may be referred to as "killer" defects because they may render a semiconductor device inoperative. For example, such defects may prevent a metal interconnect structure 40 that is formed in a contact hole from properly electrically contacting an underlying metal interconnect structure 40.

However, it may be difficult to detect such defects using conventional optical detection technologies. For example, via structures such as contact holes may have aspect ratios (height to width) on the order of 5:1 to 10:1, or higher, which may make it difficult for light to reach the bottom of such via structures. In addition, a dielectric material in which a contact hole is formed typically has a higher dielectric constant than air disposed in the contact hole. As such, this difference in dielectric constants may act as an "anti-waveguide" to repel the light from the contact hole.

Therefore, it may be difficult to detect the presence of defects in via structures, such as high aspect ratio contact holes formed in a dielectric layer. Therefore, according to various embodiments, manufacturing methods are provided that include improved inspection techniques. The various embodiment manufacturing methods may provide higher defect detection rates, as compared to conventional detection methods.

FIGS. 2A-2G are vertical cross-sectional views showing the formation and inspection of an interconnect-level structure LX of a semiconductor device, according to various embodiments of the present disclosure.

Figure 2A:
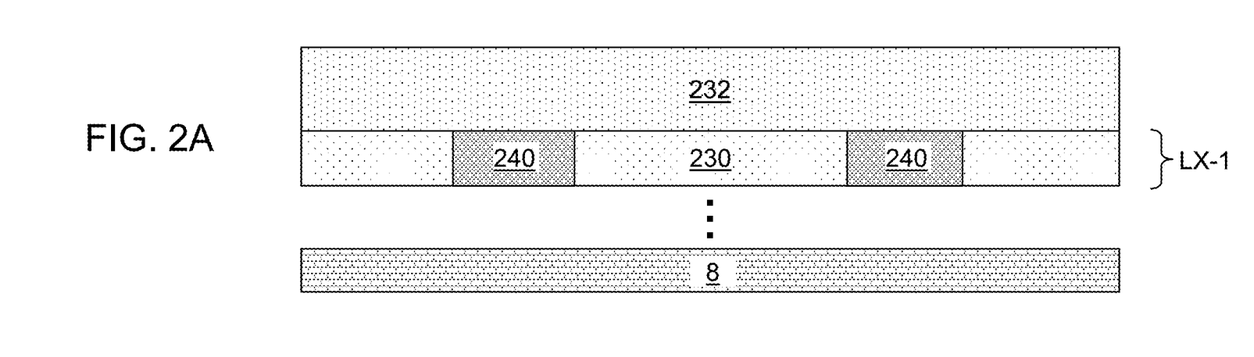
FIGS. 2A-2G are vertical cross-sectional views illustrating steps of a semiconductor device manufacturing inspection method, according to various embodiments of the present disclosure.

Referring to FIGS. 1C and 2A, an ILD layer 232 may be formed on an underlying interconnect-level structure LX-1. The interconnect-level structure LX-1 may include a metal interconnect structure 240 disposed in an ILD layer 230. For example, the interconnect-level structure LX-1 may be any of the interconnect-level structures L0-L7, the ILD layer 230 may be any of the ILD layers 30, and the metal interconnect structure 240 may be any of the metal interconnect structures 40. The interconnect-level structure LX-1 may be disposed over the substrate 8 and/or any other intervening ILD layers 30. In some embodiment, the interconnect-level structure LX-1 may be omitted, and the ILD layer 232 may be formed directly on the substrate 8.

The ILD layer 232 may include a dielectric material such as silicon oxide ($SiO_2$), silicon nitride, an undoped silicate glass, a doped silicate glass, an organosilicate glass, amorphous fluorinated carbon, porous variants thereof, combinations thereof, or the like. The ILD layer 232 may be deposited through any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

Figure 2B:
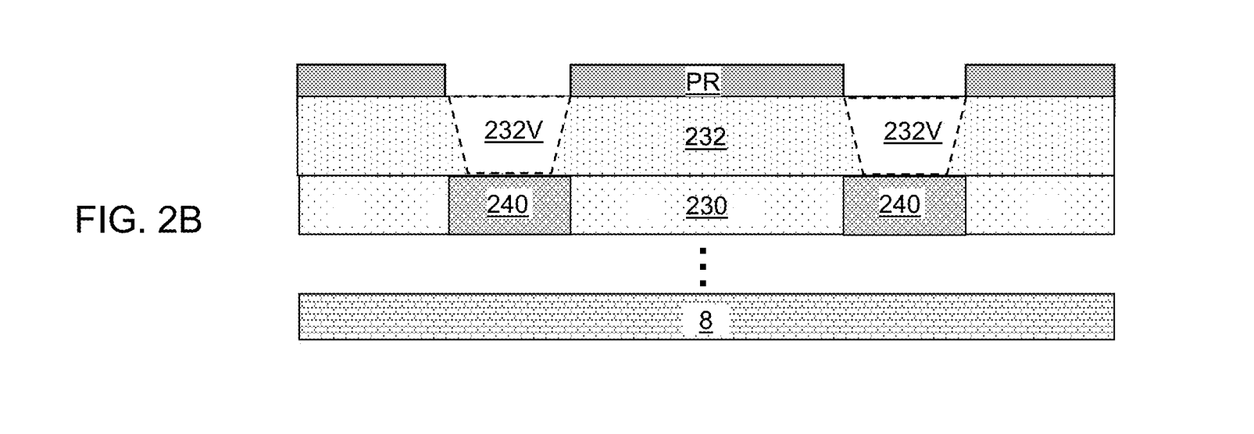

Referring to FIG. 2B, a photoresist layer PR may be applied over the ILD layer 232. The photoresist layer PR may be lithographically patterned to form via structure pattern. An anisotropic etch process may be performed to etch unmasked portions of the ILD layer 232 and form via structures 232V. The anisotropic etch process may use any suitable etching process, such as a wet or dry etching process. The photoresist layer PR may be subsequently removed, for example, by ashing.

Figure 2C:
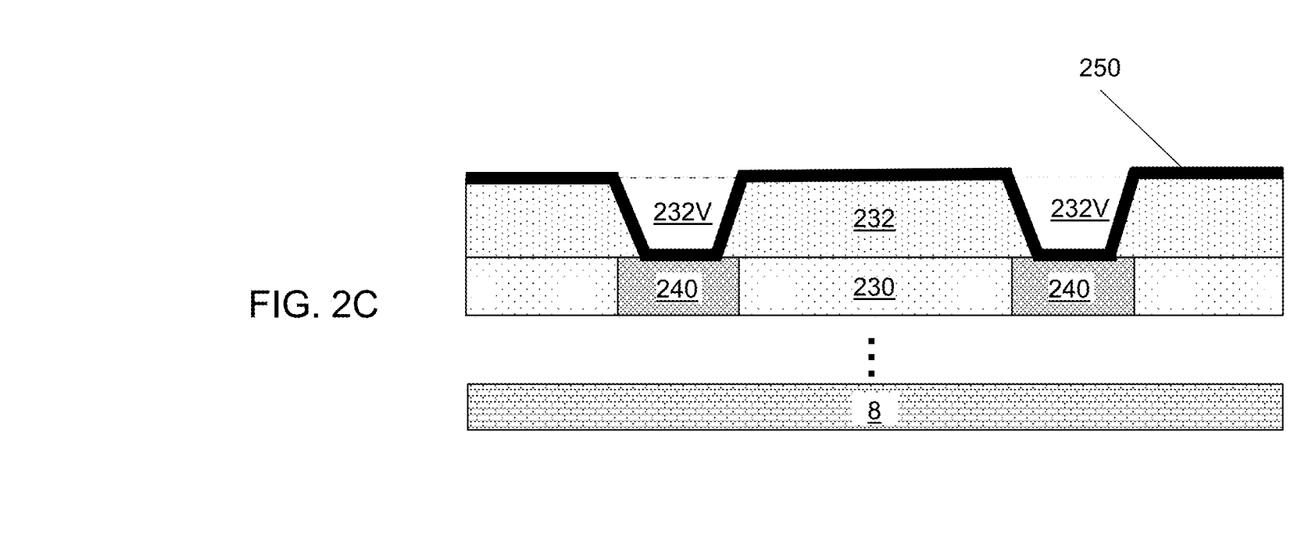

Referring to FIG. 2C, an inspection layer 250 may be deposited on the ILD layer 232, and in the via structures 232V. The inspection layer 250 may be formed by depositing an electrically conductive material, using any suitable deposition method. Suitable electrically conductive materials may include copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive materials are within the contemplated scope of disclosure. For example, in some embodiments, the inspection layer 250 may be formed of other materials, such as semiconductor materials, dielectric materials, oxidized materials, or nitride materials, so long as such materials provide an appropriate change in reflectivity.

In an alternative embodiment, the inspection layer 250 may be formed by exposing the ILD layer 232 to an inspection gas. The inspection gas may be configured to react with the surface of the ILD layer 232 and form the inspection layer 250. Suitable inspection gases include $SiH_4$, $GeH_4$, $TiCl_4$, $HfCl_4$, $AlCl_3$, $Ru(CpEt)_2$, $WF_6$, combinations thereof, or the like. Other suitable inspection gases are within the contemplated scope of disclosure.

In some embodiments, a high difference in reflectivity, between the structure with and without inspection layer 250, may be preferable. For example, the inspection layer 250 may provide a difference in reflectivity ranging from about 50% to about 200%, as compared to the reflectance of the ILD layer 232 without the inspection layer 250. For example, the inspection layer 250 may provide an increase in reflectivity ranging from about 50% to about 200%, as compared to the reflectance of the ILD layer 232 without the inspection layer 250. In some embodiments, the inspection layer 250 may have a thickness ranging from about 0.5 nm to about 100 nm, such as from about 0.2 nm to about 200 nm, although thicker or thinner inspection layer 250 may be used.

Figure 2D:
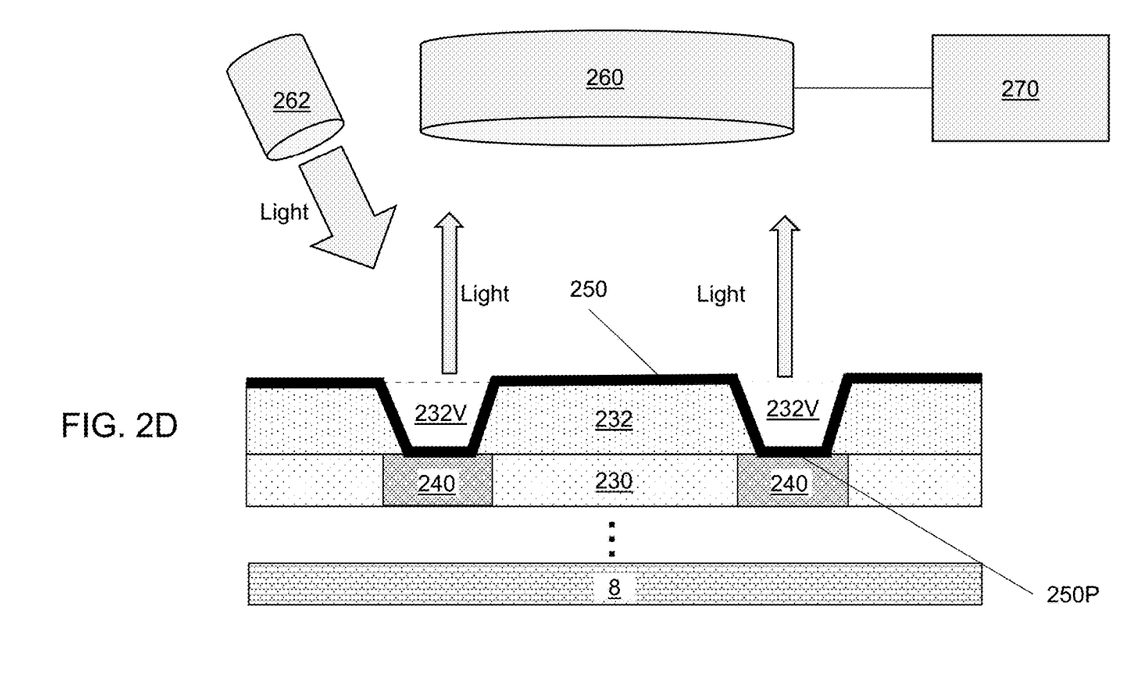
Figure 2E:
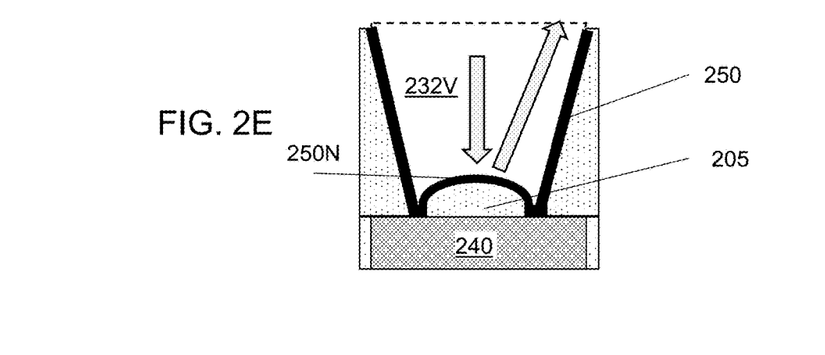

Referring to FIGS. 2D and 2E, the via structures 232V may be inspected. For example, the ILD layer 232 may be illuminated by a light source 262, and light reflected from the inspection layer 250 may be captured using an optical system 260 disposed over the ILD layer 232. The optical system 260 may include a camera and/or charged coupled device (CCD) configured to image the via structures 232V. The optical system 260 may have an optical resolution that is high enough to resolve light reflected from adjacent via structures 232V. For example, the optical system 260 may include an optical microscope.

In various embodiments, the optical system 260 may operate as a bright-field imaging system, a dark-field imaging system, a dark-field scattering imaging system, or a combination thereof. When operating as a bright-field imaging system, the ILD layer 232 may be flooded with a specular beam of light, and the optical system 260 may include an objective lens (not shown) configured to construct an optical image from a portion of the specular beam that is reflected from the inspection layer 250.

When operating as a dark-field imaging system, instead of using information from the specular beam, the optical system 260 may be placed further away from the ILD layer 232 to intercept a smaller fraction of light scattered from the inspection layer 250. When operating as a dark-field scattering imaging system, the optical system 260 may operate similarly to a dark-field imaging system, except that the signal generated by the scattered light need to be managed.

The optical system 260 may be wired or wirelessly connected to a processor 270. The processor 270 may include a central processing unit and a computer readable media storing programming instructions and may be configured to process image data received from the optical system 260, in order to determine whether one or more of the via structures 232V contain defects. In particular, the processor 270 may compare the image data to previously stored image data, which may include images of non-defective via structures and/or defective via structures, using one or more signal processing algorithms.

For example, in a non-defective via structure 232V, a portion 250P of the inspection layer 250 that covers the bottom of the non-defective via structure 232V may be planar or substantially planar. In contrast, as shown in FIG. 2E, in a via structure 232V that contains a defect 205, a portion 250N of the inspection layer 250 that covers the defect 205 may be non-planar or substantially non-planar. The planar portions 250P may reflect a different amount of light at different angles to the optical system 260 than the non-planar portions 250N. In particular, a defect 205 may result in a reduction or an increase in an amount of light that is reflected from the corresponding via structure 232V and captured by the optical system 260.

Accordingly, the defect 205 may be detected by detecting an amount of light received by the optical system 260 from each via structure 232V. For example, more light may be received from the inspection layer 250 in each of via structures 232V that do not include a defect 205, as compared to a via structure 232V that does contain a defect 205.

In particular, the processor 270 may be configured to identify the locations of the via structures 232V and compare an amount of light reflected from each of the via structures 232V to a stored emission level.

In instances in which a defect 205 is detected in one or more via structures 232V of the ILD layer 232, the fabrication process may be terminated and the ILD layer 232 and/or incomplete semiconductor device may be discarded or subjected to remedial action to mitigate the impact of the defects 205. For example, the incomplete semiconductor device may be discarded if the number of detected defects 205 exceeds a predetermined acceptable number of defects 205.

In the alternative, a cleaning and/or reworking mitigating process may be performed on the ILD layer 232, if one or more defects 205 are detected. For example, the cleaning process may include a wet etching process, a dry etching process, and/or an aerosol cleaning process where momentum transfer from inert particles is used to dislodge the particles. A reworking process may include stripping off the ILD layer 232, before restarting the process for forming the interconnect-level structure.

Figure 2F:
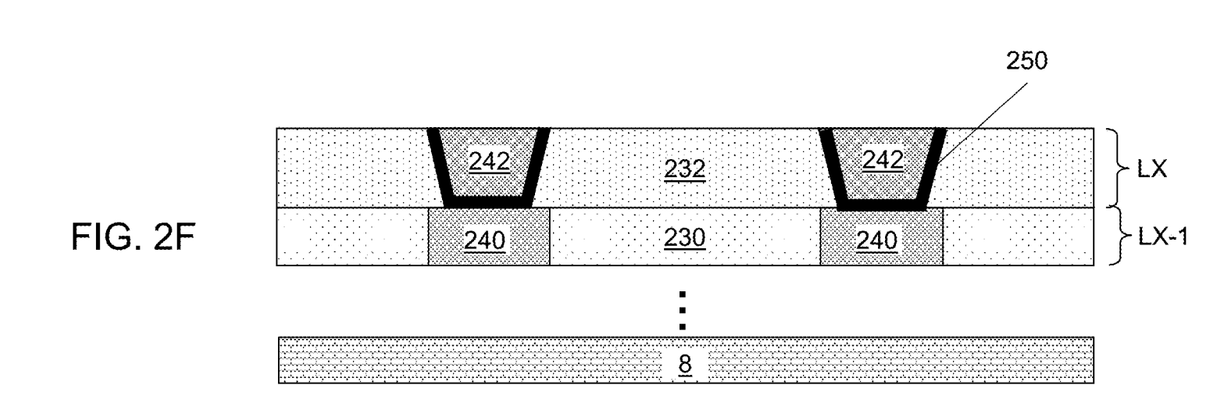

Referring to FIGS. 2D-2F, in instances in which the via structures 232V of the ILD layer 232 are determined to be acceptably free of defects, metal interconnect structures 242 may be formed in the via structures 232V. In particular, any suitable electrically conductive metal material may be deposited in the via structures 232V, using any suitable deposition method. A planarization process, such as CMP, may then be performed to planarize top surfaces of the metal interconnect structures 242 and the ILD layer 232, and to thereby complete the interconnect-level structure LX. The planarization process may also remove any residual electrically conductive material and corresponding portions of the inspection layer 250, from the top surface of the ILD layer 232. In some embodiments, portions of the inspection layer 250 may remain in the via structures 232V of the ILD layer 232 after the CMP process.

Figure 2G:
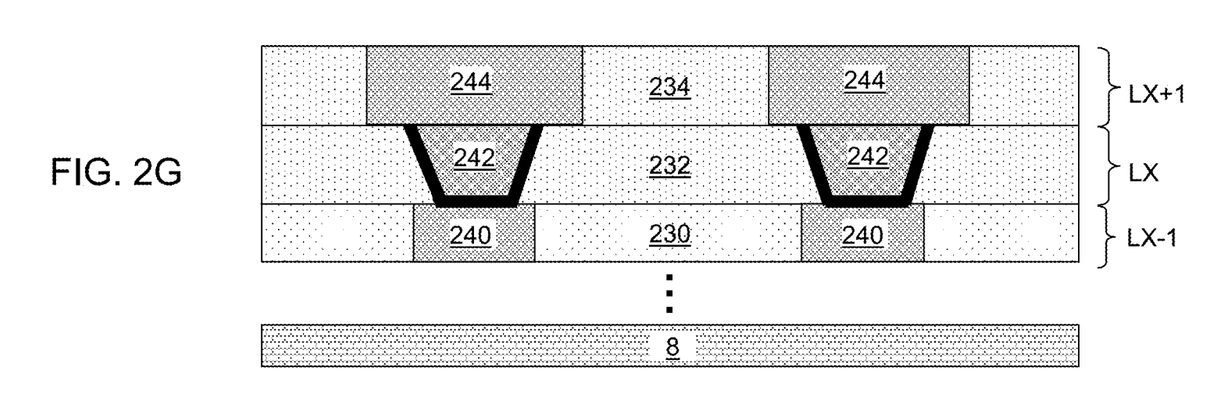

Referring to FIG. 2G, one or more additional interconnect-level structures LX+1, etc., may be formed on the interconnect-level structure LX, using similar processes, to form a complete semiconductor device, such as the semiconductor device 100 of FIG. 2C. For example, the additional interconnect-level structure LX+1 may include an ILD layer 234 and interconnect structures 244. In some embodiments, the interconnect structures 244 may contact portions of the inspection layer 250 that remain in the via structures 232V of the ILD layer 232 after the CMP process.

Referring again to FIG. 2C, in other embodiments, the inspection layer 250 may be formed by exposing the ILD layer 232 to an inspection gas. The inspection gas may be configured to change the properties of the surface of ILD layer 232, and thereby form the inspection layer 250. For example, the inspection gas may be configured to react with the surface of the ILD layer 232. The inspection gas may be configured to increase or decrease the reflectance of the ILD layer 232. Suitable inspection gases may include $SiH_4$, $GeH_4$, $TiCl_4$, $HfCl_4$, $AlCl_3$, $Ru(CpEt)_2$, $WF_6$, combinations thereof, or the like. Other suitable inspection gases are within the contemplated scope of disclosure.

Figure 3A:
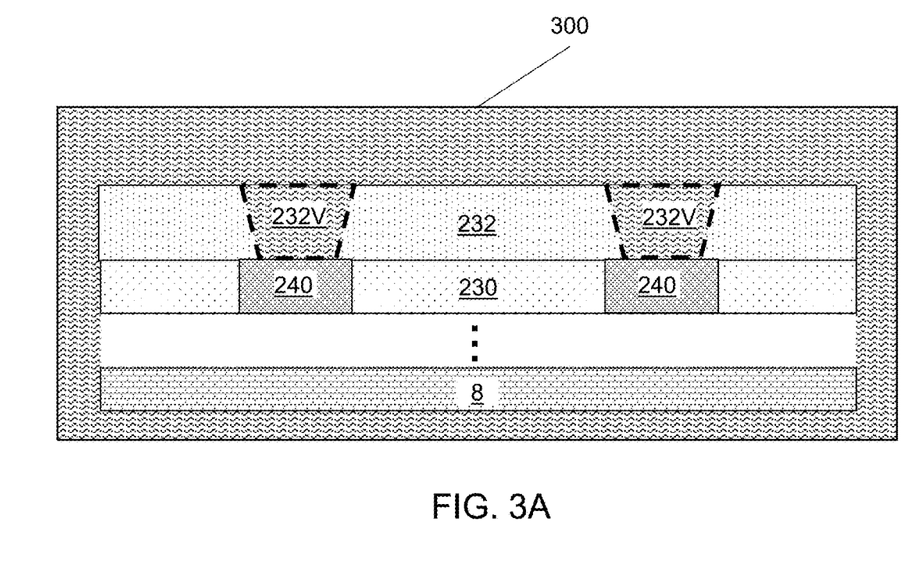
FIGS. 3A-3C are vertical cross-sectional views illustrating alternate steps that may be employed in the method of FIGS. 2A-2G.
Figure 3B:
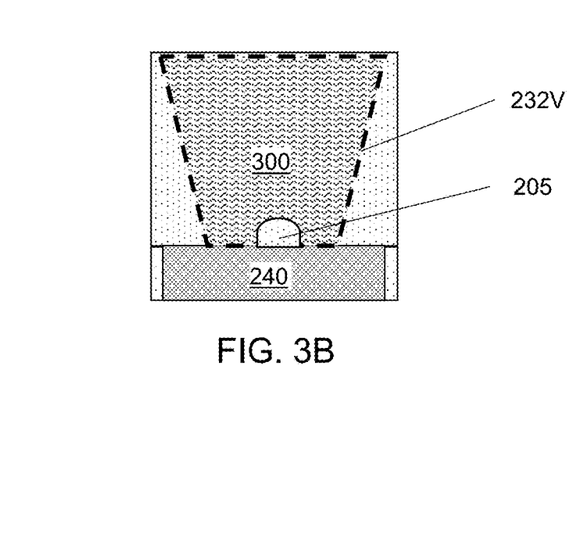
Figure 3C:
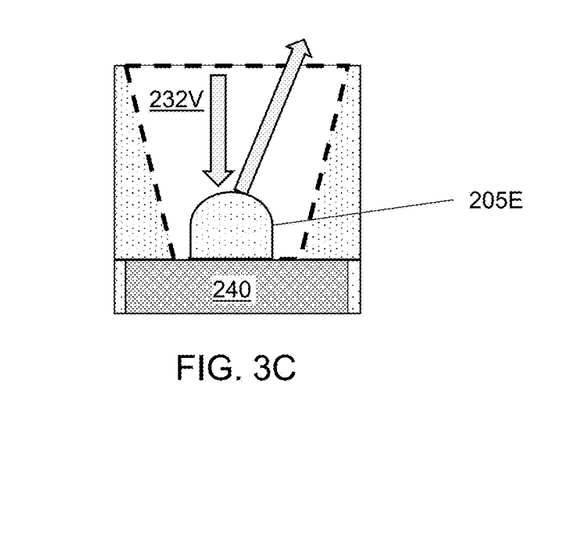

FIGS. 3A-3C are cross-sectional views showing alternative steps that may be utilized in the method of FIGS. 2A-2G. Referring to FIG. 3A, the photoresist layer PR may be removed from the device structure shown in FIG. 2B, and an inspection fluid 300 may be applied to the device structure. For example, the device structure may be immersed in the inspection fluid 300, or the inspection fluid 300 may be coated on the ILD layer 232. As shown in FIGS. 3A and 3B, the inspection fluid 300 may be applied so as to fill the via structures 232V and directly contact any defects 205 disposed therein.

The inspection fluid 300 may be configured to increase the size of any defects 205. For example, the inspection fluid 300 may swell a defect 205 or otherwise increase the size of the defect 205 via a chemical reaction. Suitable inspection fluids 300 include $H_2O$, $AgNO_3(aq)$, $(NH_4)_3[Au(SO_3)_2]$, $NiSO_4 \cdot (H_2O)_6$, combinations thereof, or the like. Other suitable inspection fluids are within the contemplated scope of disclosure.

The inspection fluid 300 may be applied for a sufficient amount of time to suitably enlarge any defects 205, and thereby form an enlarged defect 205E before being removed, as shown in FIG. 3C. The inspection fluid 300 may then be removed using any suitable method, such as by wiping, heating, forced air, or the like.

As shown in FIGS. 3C, an optical inspection process may be performed to detect any enlarged defects 205E. The method may proceed as described above, with respect to FIGS. 2D-2G, except that no inspection layer 250 is formed. In other embodiments, the inspection layer 250 may be formed by either deposition techniques or grown through the exposure to an inspection gas. The inspection layer 250 may optionally be formed after applying the inspection fluid 300 to enlarge any defect for optical inspection.

Figure 4A:
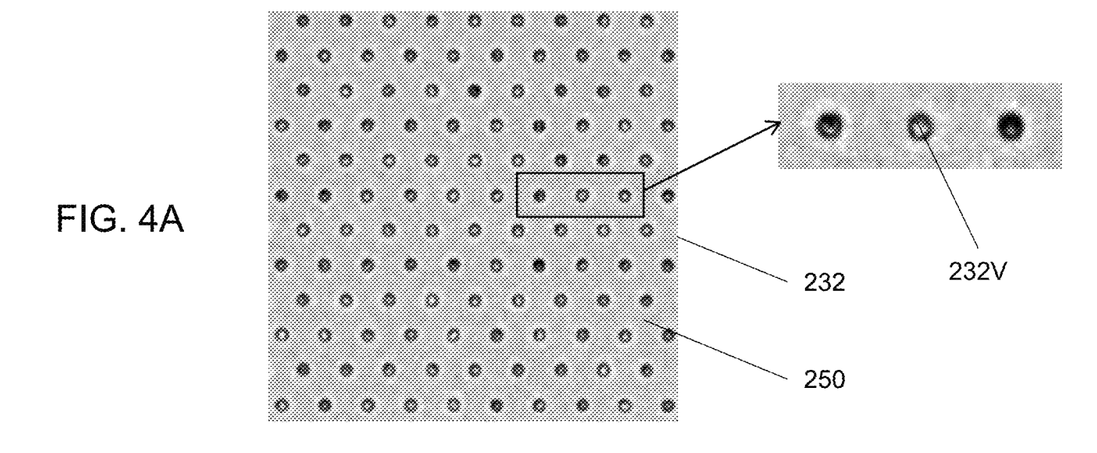
FIGS. 4A and 4B are micrographs respectively showing cross-sectional views illustrating a succession of steps in the formation of a memory structure, according to various embodiments of the present disclosure.
Figure 4B:
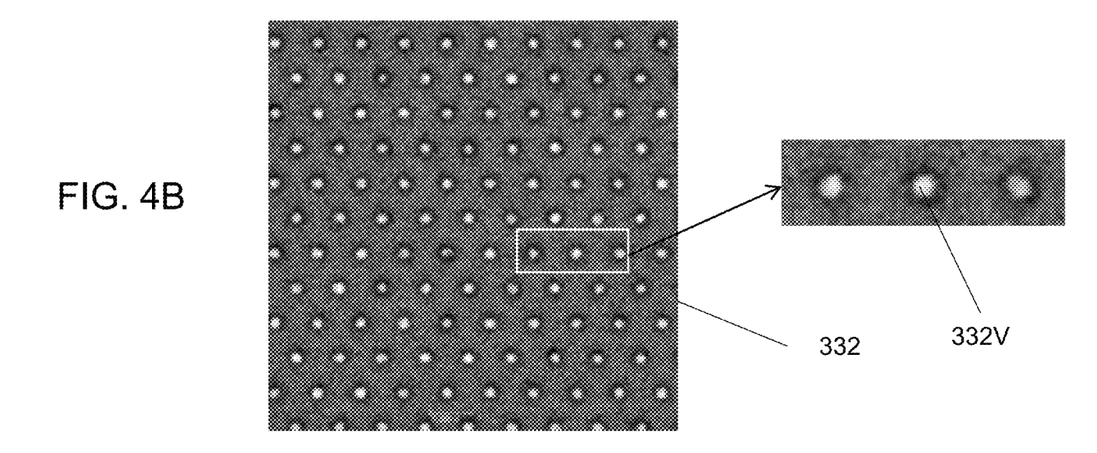

FIG. 4A a micrograph of an ILD layer 232 that includes via structures 232V and an inspection layer 250, and FIG. 4B is a micrograph of an ILD layer 332 including via structures 332V and that does not include an inspection layer to provide increased contrast, such as inspection layer 250. Referring to FIGS. 4A and 4B, the ILD layer 232 has a higher overall reflectivity and a higher contrast between via structures 232V that include defects 205 and via structures that do not include defects, as compared to the ILD layer 332, due to the presence of the inspection layer 250.

Figure 5:
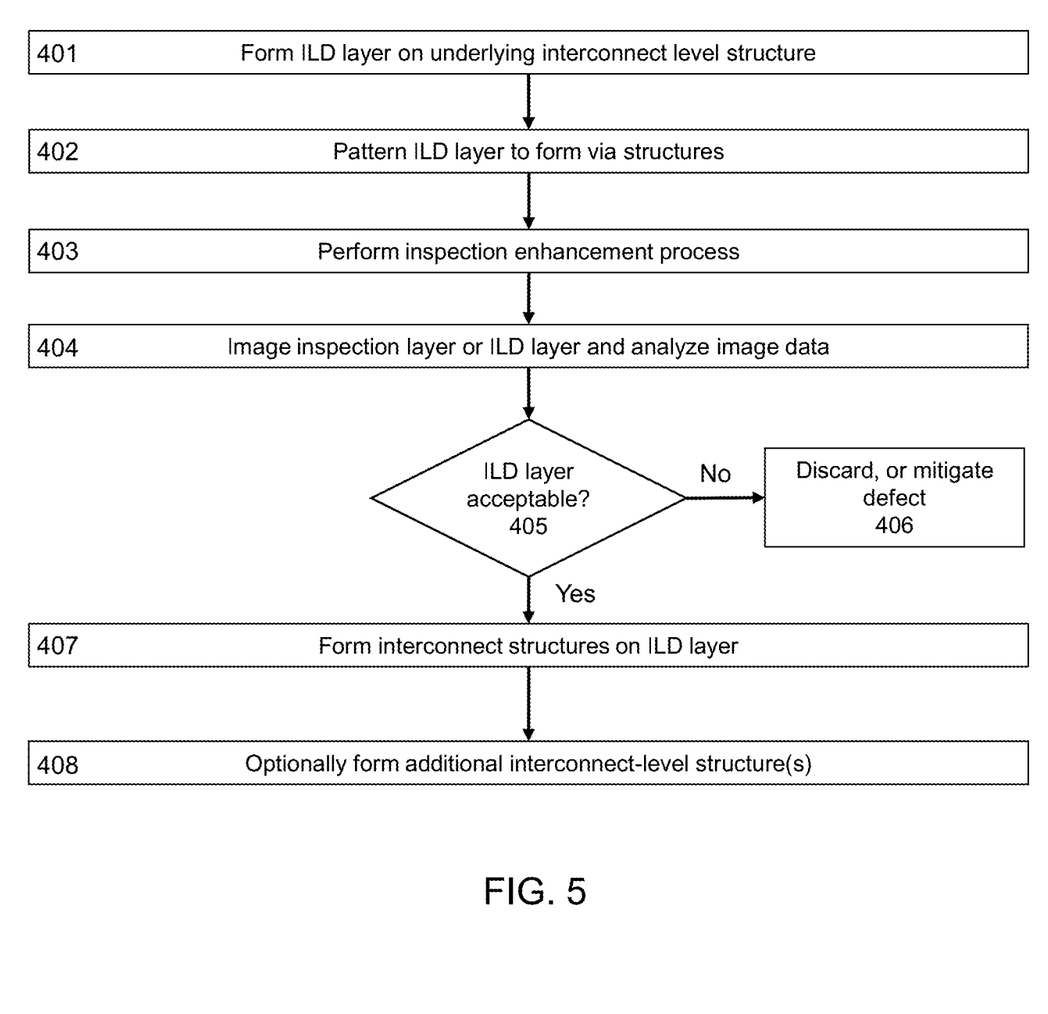
FIG. 5 is a flow chart illustrating a method of forming a memory structure, according to various embodiments of the present disclosure.

FIG. 5 is a flow diagram illustrating steps of inspecting a via structure 332V, according to various embodiments of the present disclosure. Referring to FIGS. 5, 2A-2G, and 3A-3C, in step 401, a device layer may be deposited over a semiconductor substrate 8. In the present embodiment, the device layer is exemplified as an ILD layer 232. However, the present disclosure is not limited to any particular device layer. For example, the device layer may include metal layers, semiconductor layers, dielectric layers, combinations thereof, or the like.

The ILD layer 232 may be formed on an underlying ILD layer 230 or may be formed directly on the semiconductor substrate 8, using any suitable deposition process to deposit any suitable dielectric material. For example, the ILD layer 232 may be formed of silicon oxide or the like.

In step 402, the ILD layer 232 may be patterned to form via structures 232V. In particular, a photoresist material may be deposited and lithographically patterned to form a patterned photoresist layer PR. The ILD layer 232 may be etched, using the patterned photoresist layer PR as a mask, to form the via structures 232V.

In step 403, an inspection enhancement process may be performed. For example, an inspection layer 250 may be deposited on the ILD layer 232. In some embodiments, the inspection layer 250 may be formed by depositing an electrically conductive material, using any suitable deposition method. Suitable electrically conductive materials may include copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive materials are within the contemplated scope of disclosure. In some embodiments, a highly reflective electrically conductive material, such as titanium, may be preferable.

In the alternative, the inspection layer 250 may be formed by applying an inspection gas to the ILD layer 232. The inspection gas may be configured to change the properties of the surface of ILD layer 232, and thereby form the inspection layer 250.

In other embodiments, the inspection enhancement process may include applying an inspection fluid to the ILD layer 232, in order to enlarge any defects 205 present thereon.

In step 404, the ILD layer 232 or inspection layer 250 may be optically imaged. In particular, ILD layer 232 or the inspection layer 250 may be illuminated, and light reflected from the ILD layer 232 or inspection layer 250 may be captured by an optical system 260. Image data generated by the optical system 260 may be provided to a processor 270. The processor 270 may include a central processing unit and programing instructions stored in a computer readable medium. The processor 270 may be configured to compare the intensity of light emitted from each via structure 232V to a threshold intensity, in order to determine whether a defect is detected in any of the via structures 232V.

In step 405, a determination may be made as to whether the ILD layer 232 is acceptable. For example, if more than an acceptable number of defects is detected, the ILD layer 232 may be determined to be unusable. Similarly, if an acceptable number of defects is detected, the ILD layer may be determined to be acceptable for further processing. If the ILD layer 232 is determined to be unacceptable, the method proceeds to step 406. If the ILD layer 232 is determined to be acceptable, such as if no defects or an acceptably low number of defects is detected, the method proceeds to step 407.

In step 406, the structure imaged in step 404 may be discarded. In the alternative, the structure may be reworked to mitigate the defect that is detected in steps 404 and 405.

In step 407, interconnect structures 242 may be formed in the via structures 232V. In particular, any suitable electrically conductive material may be deposited in the via structures 232V, using any suitable deposition process. A planarization process, such as CMP, may then be performed to planarize upper surfaces of the interconnect structures 242 and the ILD layer 232, and complete the formation of an interconnect-level structure LX. The method may then optionally proceed to step 408.

In step 408, one or more additional interconnect-level structure LX+1, etc., may optionally be formed on the interconnect-level structure LX, to complete a semiconductor device. For example, steps 401-405 and 407 may be repeated to form additional interconnect-level structures.

In various embodiments, provided is a semiconductor device inspection method comprising: depositing a dielectric material over a substrate 8 to form an interconnect-level dielectric (ILD) layer 232; patterning the ILD layer 232 to form via structures 232V in the ILD layer 232; depositing an electrically conductive material to form an inspection layer 250 on the ILD layer 232 and in the via structures 232V; imaging the inspection layer 250 to generate image data; and detecting any defects in the via structures 232V by analyzing the image data.

Various embodiments provide a semiconductor device inspection method comprising: forming a device layer 232 over a substrate 8; patterning the device layer 232 to form via structures 232V in the device layer 232; forming an inspection enhancement process comprising: forming an inspection layer 250 on the device layer and in the via structures 232V; or applying an inspection fluid 300 to the device layer 232 and the via structures 232V to enlarge any defects present on the device layer 232; imaging the device layer 232 or the inspection layer 250 to generate image data; detecting any defects 205 in the via structures 232V by analyzing the image data; determining whether the device layer 232 is acceptable or unacceptable, based on a number of detected defects 205.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device inspection method comprising:
   depositing a dielectric material over a substrate to form an interconnect-level dielectric (ILD) layer;
   patterning the ILD layer to form via structures in the ILD layer;
   forming an inspection layer on the ILD layer and in the via structures; and
   optically inspecting the inspection layer to detect whether any of the via structures comprise defects based on a comparison between an intensity of light reflected from each via structure and a threshold intensity.

2. The method of claim 1, wherein the forming the inspection layer comprises depositing, on the ILD layer, a metal layer comprising copper, aluminum, zirconium, titanium, titanium nitride, tungsten, tantalum, tantalum nitride, ruthenium, palladium, platinum, cobalt, nickel, iridium, or alloys thereof.

3. The method of claim 1, wherein the inspection layer has a reflectivity ranging from 50% to 200% greater than a reflectivity of the ILD layer.

4. The method of claim 1, wherein the inspection layer has a thickness ranging from about 0.5 nm to about 100 nm.

5. The method of claim 1, wherein the forming the inspection layer comprises exposing the ILD layer to an inspection gas to form the inspection layer,
   wherein the inspection gas comprises $SiH_4$, $GeH_4$, $TiCl_4$, $HfCl_4$, $AlCl_3$, $Ru(CpEt)_2$, $WF_6$, or any combination thereof.

6. The method of claim 1, wherein:
   the via structures comprise contact holes having an aspect ratio of at least 5:1; and
   the defects comprise particles disposed in the contact holes, incompletely etched contact holes, or a combination thereof.

7. The method of claim 1, wherein the optically inspecting the inspection layer comprises:
   using bright field imaging, dark-field imaging, or a combination thereof, to generate image data; and
   comparing the image data to stored image data.

8. The method of claim 1, further comprising determining whether the ILD layer is acceptable based on a number of the defects that are detected.

9. The method of claim 8, further comprising forming interconnect structures in the via structures, in response to determining that the ILD layer is acceptable.

10. A method of inspecting contact holes formed in an interconnect-level dielectric (ILD) layer of a semiconductor device, the method comprising:
   depositing an electrically conductive material on the ILD layer and in the contact holes to form an inspection layer; and
   optically inspecting the inspection layer to determine whether any defects are present in the contact holes based on a comparison between an intensity of light reflected from each contact hole and a threshold intensity.

11. The method of claim 10, wherein the electrically conductive material comprises copper, aluminum, zirconium, titanium, titanium nitride, tungsten, tantalum, tantalum nitride, ruthenium, palladium, platinum, cobalt, nickel, iridium, or alloys thereof.

12. The method of claim 10, wherein the inspection layer has a reflectivity ranging from 50% to 200% greater than a reflectivity of the ILD layer.

13. The method of claim 10, wherein the inspection layer has a thickness ranging from about 0.5 nm to about 100 nm.

14. The method of claim 10, wherein:
   the contact holes having an aspect ratio of at least 5:1; and
   the defects comprise particles disposed in the contact holes, incompletely etched contact holes, or a combination thereof.

15. The method of claim 10, wherein the optically inspecting the inspection layer comprises:
   using bright field imaging, dark-field imaging, or a combination thereof, to generate image data; and
   comparing the image data to stored image data.

16. The method of claim 10, further comprising determining whether the ILD layer is acceptable based on a number of the defects that are detected.

17. The method of claim 16, further comprising:
   forming interconnect structures in the via structures, in response to determining that the ILD layer is acceptable; or
   removing the ILD layer or mitigating the detected defects, in response to determining that the ILD layer is not acceptable.

18. A method of inspecting via structures formed in a device layer of a semiconductor device, the method comprising:
   applying an inspection fluid to the device layer, the inspection fluid configured to enlarge any defects present in the via structures;
   optically inspecting the device layer to detect any defects in the via structures; and
   determining whether the device layer is acceptable based on a number of detected defects.

19. The method of claim 18, wherein the inspection fluid comprises $H_2O$, $AgNO_3(aq)$, $(NH_4)_3[Au(SO_3)_2]$, $NiSO_4 \cdot (H_2O)_6$, or any combination thereof.

20. The method of claim 19, wherein:
   the inspection fluid is applied for a time period sufficient to swell the defects; and
   the inspection fluid is removed prior to optically inspecting the device.

* * * * *